(12) United States Patent
Iijima

(10) Patent No.: US 7,639,166 B2
(45) Date of Patent: Dec. 29, 2009

(54) D/A CONVERTER CIRCUIT

(75) Inventor: Takashi Iijima, Gunma (JP)

(73) Assignees: Sanyo Electric Co., Ltd., Moriguchi-shi (JP); Sanyo Semiconductor Co., Ltd., Ora-gun (JP)

( * ) Notice: Subject to any disclaimer, the term of this patent is extended or adjusted under 35 U.S.C. 154(b) by 0 days.

(21) Appl. No.: 12/138,236

(22) Filed: Jun. 12, 2008

(65) Prior Publication Data

US 2008/0316078 A1  Dec. 25, 2008

(30) Foreign Application Priority Data

Jun. 21, 2007  (JP)  ............................. 2007-163609

(51) Int. Cl.
   *H03M 1/66*  (2006.01)
(52) U.S. Cl. .................. 341/145; 341/144; 341/154
(58) Field of Classification Search ......... 341/144–146, 341/154, 136
   See application file for complete search history.

(56) References Cited

U.S. PATENT DOCUMENTS

| | | | | |
|---|---|---|---|---|
| 3,997,892 A | * | 12/1976 | Susset ........................ | 341/136 |
| 4,638,303 A | * | 1/1987 | Masuda et al. ............... | 341/136 |
| 5,495,245 A | * | 2/1996 | Ashe ........................... | 341/145 |
| 5,977,898 A | * | 11/1999 | Ling et al. ................... | 341/144 |
| 6,384,762 B2 | * | 5/2002 | Brunolli et al. ............. | 341/144 |
| 6,781,536 B1 | * | 8/2004 | Martins ....................... | 341/144 |

FOREIGN PATENT DOCUMENTS

JP          10-135836          5/1998

* cited by examiner

*Primary Examiner*—Jean B Jeanglaude
(74) *Attorney, Agent, or Firm*—Morrison & Foerster LLP (57) ABSTRACT

A multi-bit D/A converter circuit that prevents a bit inversion and requires a reduced layout area is offered. A first switching circuit is provided in order to select a pair of analog voltages generated across one of resistors in a first resistor string. The selected pair of analog voltages is provided as reference voltages to a second resistor string. A second switching circuit is provided in order to select a pair of analog voltages generated across one of the resistors in the second resistor string. The selected pair of analog voltages is provided as reference voltages to a third resistor string. A third switching circuit is provided in order to select one of analog voltages generated in the third resistor string.

5 Claims, 10 Drawing Sheets

D/A CONVERTER CIRCUIT

CROSS-REFERENCE OF THE INVENTION

This application claims priority from Japanese Patent Application No. 2007-163609, the content of which is incorporated herein by reference in its entirety.

BACKGROUND OF THE INVENTION

1. Field of the Invention

This invention relates to a D/A converter circuit using resistor strings.

2. Description of the Related Art

Figure 9:
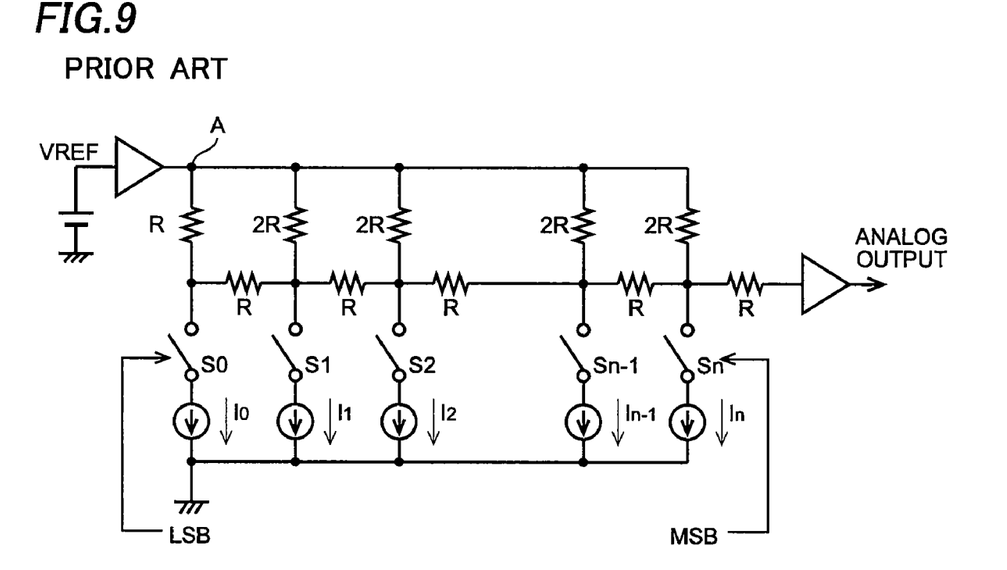
FIG. 9 is a circuit diagram showing a structure of a conventional R-2R type D/A converter circuit.

An R-2R type D/A converter circuit has been known as a D/A converter circuit using ladder resistors. This type of D/A converter circuit is provided with the R-2R ladder resistors to which a reference voltage VREF is supplied, (n+1) constant current sources each corresponding to each of (n+1) bits (ranging from LSB (Least Significant Bit) to MSB (Most Significant Bit)) in a digital signal, respectively, and (n+1) switches S0-Sn each corresponding to each of the (n+1) bits in the digital signal, respectively, as shown in FIG. 9, and is capable of converting the (n+1) bit digital signal into an analog signal by turning the switches S0-Sn on/off. This type of D/A converter circuit is disclosed in Japanese Patent Application Publication No. H10-135836.

Figure 10:
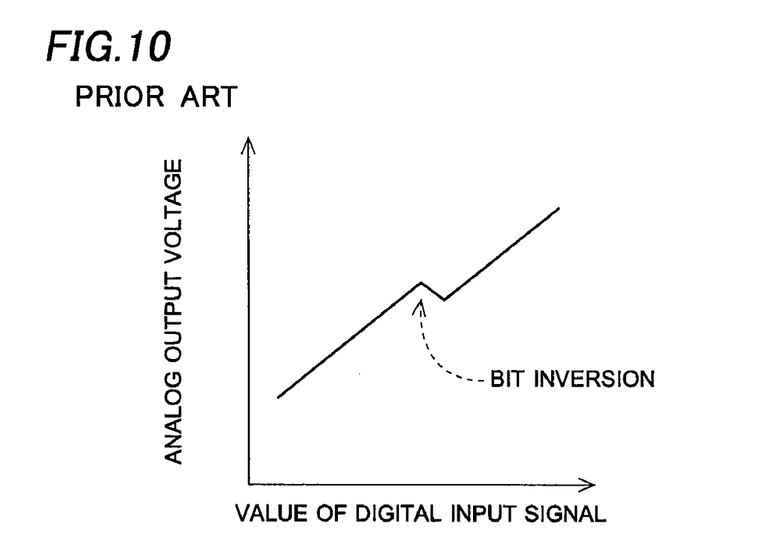
FIG. 10 shows a bit inversion in the conventional R-2R type D/A converter circuit.

When data of the (n+1) bit digital signal varies, the switches S0-Sn are turned on or off accordingly, and corresponding currents flow from the constant current sources to the R-2R ladder resistors in the circuit described above. At that time, however, there is caused a slight fluctuation in a voltage (the reference voltage VREF) at a node A shown in FIG. 9. In addition, there are caused slight variations in ratios among constant currents I0-In drawn from the (n+1) constant current sources that are made of current mirrors. As a result, there is caused a "bit inversion" in a six-bit or more than six-bit D/A converter circuit, as shown in FIG. 10. The bit inversion means a drop in an analog output voltage as a value of the digital signal increases.

Figure 11:
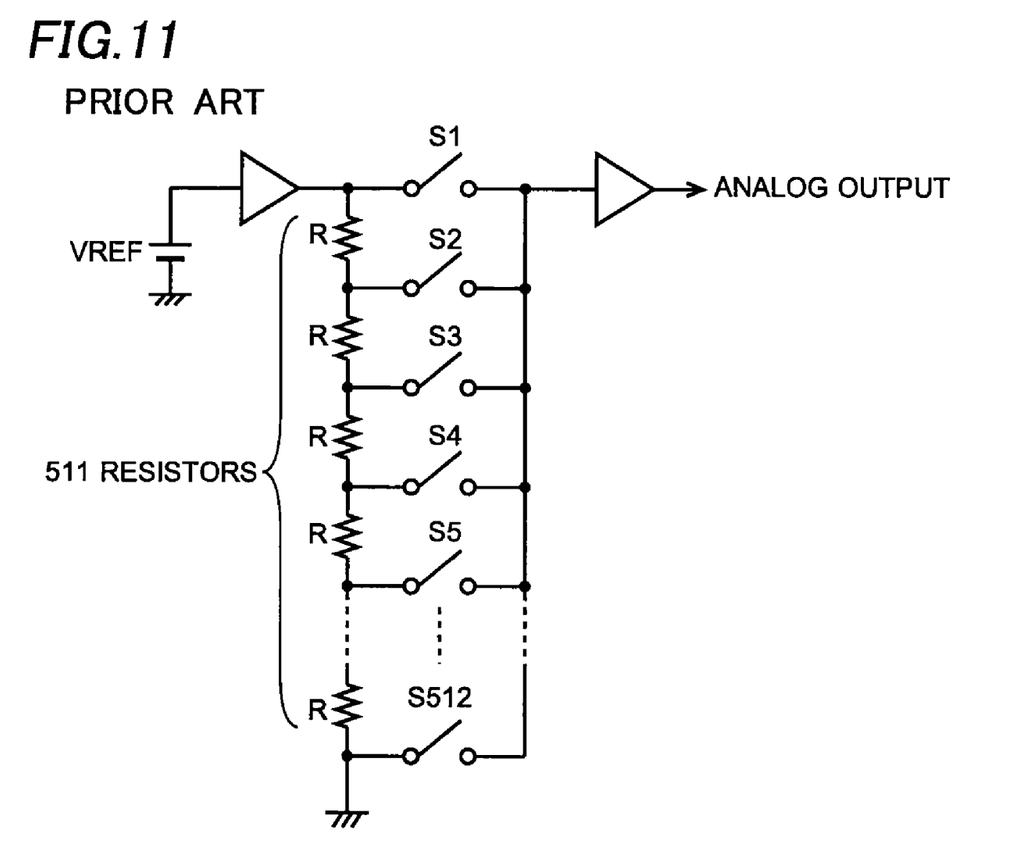
FIG. 11 is a circuit diagram showing a structure of a conventional resistor string type D/A converter circuit.

Also, there has been known a D/A converter circuit using a resistor string as shown in FIG. 11. It is a nine-bit D/A converter circuit provided with a resistor string composed of 511 serially connected resistors to which a reference voltage VREF is supplied and 512 switches S1-S512 and capable of converting a nine-bit digital signal into an analog signal by turning the switches S1-S512 on/off corresponding to the nine-bit digital signal. Although the bit inversion does not occur in the D/A conversion circuit using the resistor string, there is a problem that it takes a very large layout area (as large as five times of a layout area required by the R-2R type D/A converter circuit in the case of the nine-bit D/A converter circuit).

This invention is directed to offering a multi-bit (six-bit or more than six-bit) D/A converter circuit that is capable of preventing the bit inversion as well as reducing the layout area.

SUMMARY OF THE INVENTION

This invention offers a D/A converter circuit that converts a digital input signal including a plurality of upper bits and a plurality of lower bits into an analog voltage, having a first resistor string that generates a plurality of analog voltages, a first switching circuit that selects a pair of analog voltages out of the plurality of analog voltages generated by the first resistor string in accordance with the plurality of upper bits, buffers, a second resistor string that is provided with the selected pair of analog voltages as reference voltages through the buffers and generates a plurality of analog voltages, and a second switching circuit that selects a pair of analog voltages out of the plurality of analog voltages generated by the second resistor string in accordance with the plurality of lower bits.

With the resistor string type D/A converter circuit described above, reducing a layout area as well as preventing a bit inversion is made possible, because the number of resistors and the number of switches can be reduced.

DETAILED DESCRIPTION OF THE INVENTION

Figure 1:
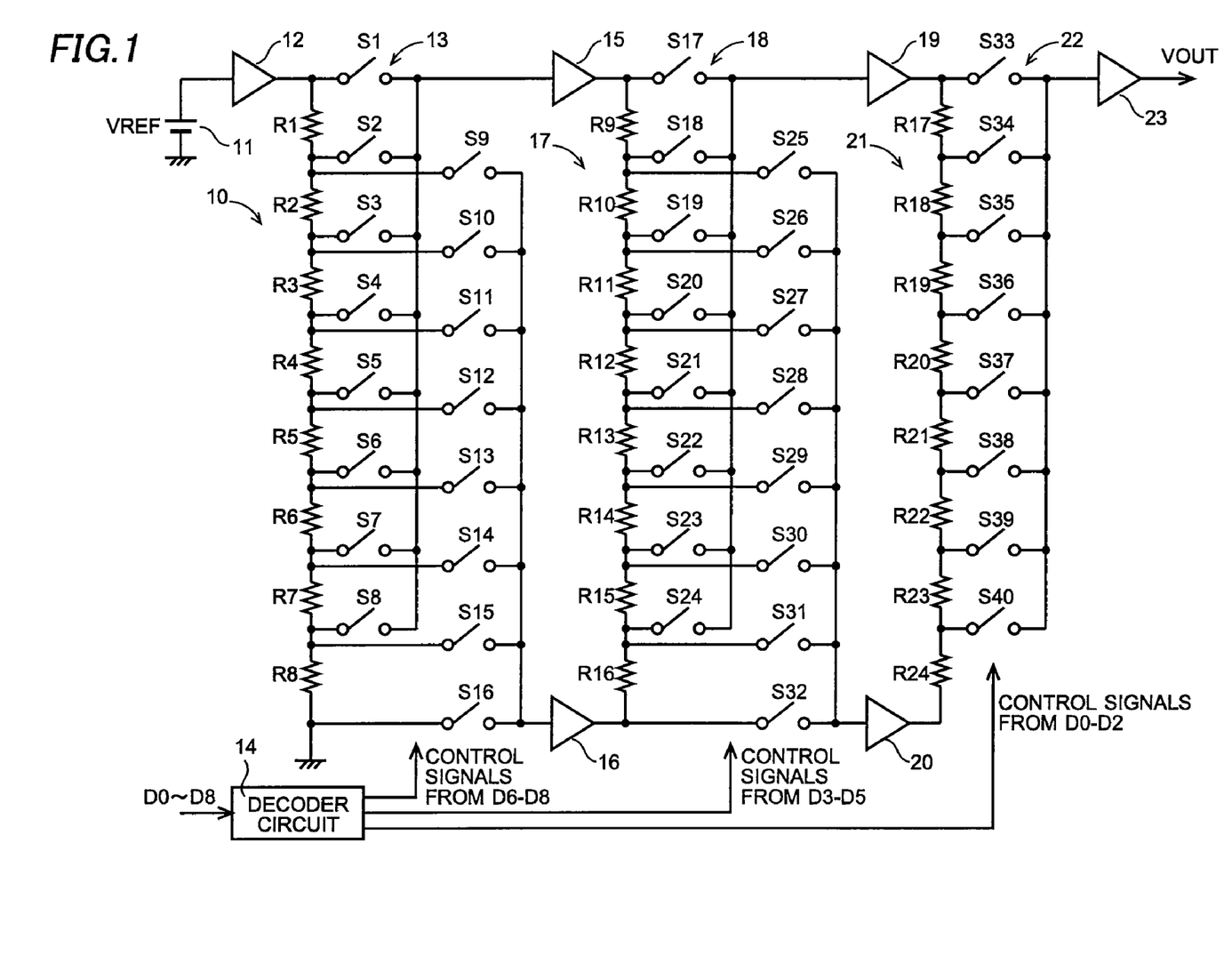
FIG. 1 is a circuit diagram showing a structure of a D/A converter circuit according to a first embodiment of this invention.

FIG. 1 shows a structure of a nine-bit D/A converter circuit according to a first embodiment of this invention. A first resistor string 10 is composed of eight resistors R1-R8 connected in series. A reference voltage VREF generated by a reference voltage source 11 is supplied to an end of the resistor R1 through a buffer 12. An end of the resistor R8 is grounded. As a result, there are generated nine analog voltages ranging from 0 to VREF, each at each end of the resistors R1-R8 in the first resistor string 10. It is preferable that the resistors R1-R8 have the same resistance as the others so that the nine analog voltages increase by a constant increment.

A first switching circuit 13 is provided in order to select a pair of analog voltages generated across one of the resistors R1-R8 in the first resistor string 10. The first switching circuit 13 is composed of 16 switches S1-S16. A decoder circuit 14 decodes values of upper three bits (D8, D7, D6) in a nine-bit input digital signal D0-D8 to generate signals to control the first switching circuit 13. Table 1 shows correlation between the values of the upper three bits (D8, D7, D6) and the switches turned on accordingly.

TABLE 1

| D8 | D7 | D6 | Switches Turned ON | Voltages Selected |
|---|---|---|---|---|
| 0 | 0 | 0 | S8, S16 | Voltages at Both Ends of R8 |
| 0 | 0 | 1 | S7, S15 | Voltages at Both Ends of R7 |
| 0 | 1 | 0 | S6, S15 | Voltages at Both Ends of R6 |
| 0 | 1 | 1 | S5, S13 | Voltages at Both Ends of R5 |
| 1 | 0 | 0 | S4, S12 | Voltages at Both Ends of R4 |
| 1 | 0 | 1 | S3, S11 | Voltages at Both Ends of R3 |
| 1 | 1 | 0 | S2, S10 | Voltages at Both Ends of R2 |
| 1 | 1 | 1 | S1, S9 | Voltages at Both Ends of R1 |

Each of the pair of analog voltages across the resistor selected by the first switching circuit 13 is provided to each end of a second resistor string 17 through each of buffers 15 and 16 as a reference voltage, respectively. Each of the buffers 15 and 16 is composed of an operational amplifier having high input impedance and low output impedance, for example.

When the values of the upper three bits (D8, D7, D6) in the digital signal are (1, 1, 0), for example, the switches S2 and S10 are turned on. Analog voltages VREFx6/8 and VREFx7/8 are generated at both ends of the resistor R2. The analog voltage VREFx7/8 is provided to one end of the second resistor string 17 through the switch S2 and the buffer 15, while the analog voltage VREFx6/8 is provided to another end of the second resistor string 17 through the switch S10 and the buffer 16.

Since the second resistor string 17 is composed of eight resistors R9-R16 connected in series, there are generated nine analog voltages each at each end of the resistors R9-R16 in the second resistor string 17. It is preferable that the resistors R9-R16 have the same resistance as the others so that the nine analog voltages increase by a constant increment.

A second switching circuit 18 is provided in order to select a pair of analog voltages generated across one of the resistors R9-R16 in the second resistor string 17. The second switching circuit 18 is composed of 16 switches S17-S32. The decoder circuit 14 decodes values of middle three bits (D5, D4, D3) in the nine-bit digital input signal D0-D8 to generate signals to control the second switching circuit 18. Table 2 shows correlation between the values of the middle three bits (D5, D4, D3) and the switches turned on accordingly.

TABLE 2

| D5 | D4 | D3 | Switches Turned ON | Voltages Selected |
|---|---|---|---|---|
| 0 | 0 | 0 | S24, S32 | Voltages at Both Ends of R16 |
| 0 | 0 | 1 | S23, S31 | Voltages at Both Ends of R15 |
| 0 | 1 | 0 | S22, S30 | Voltages at Both Ends of R14 |
| 0 | 1 | 1 | S21, S29 | Voltages at Both Ends of R13 |
| 1 | 0 | 0 | S20, S28 | Voltages at Both Ends of R12 |
| 1 | 0 | 1 | S19, S27 | Voltages at Both Ends of R11 |
| 1 | 1 | 0 | S18, S26 | Voltages at Both Ends of R10 |
| 1 | 1 | 1 | S17, S25 | Voltages at Both Ends of R9 |

Each of the pair of analog voltages across the resistor selected by the second switching circuit 18 is provided to each end of a third resistor string 21 through each of buffers 19 and 20 as a reference voltage, respectively. Each of the buffers 19 and 20 is composed of an operational amplifier having high input impedance and low output impedance, for example.

When the values of the middle three bits (D5, D4, D3) in the digital signal are (1, 1, 0), for example, the switches S18 and S26 are turned on. Analog voltages VREF'x6/8 and VREF'x7/8 are generated at both ends of the resistor R10. VREF' represents a difference between electric potentials at both ends of the second resistor string 17. The analog voltage VREF'x7/8 is provided to one end of the third resistor string 21 through the switch S18 and the buffer 19, while the analog voltage VREF'x6/8 is provided to another end of the third resistor string 21 through the switch S19 and the buffer 20.

Since the third resistor string 21 is composed of eight resistors R17-R24 connected in series, there are generated eight analog voltages each at each end of the resistors R17-R24 in the third resistor string 21. It is preferable that the resistors R17-R24 have the same resistance as the others so that the eight analog voltages increase by a constant increment.

A third switching circuit 22 is provided in order to select one of the eight analog voltages generated in the third resistor string 21. The third switching circuit 22 is composed of eight switches S33-S40. The decoder circuit 14 decodes values of lower three bits (D2, D1, D0) in the nine-bit digital input signal D0-D8 to generate signals to control the third switching circuit 22. Table 3 shows correlation between the values of the lower three bits (D2, D1, D0) and the switches turned on accordingly.

TABLE 3

| D2 | D1 | D0 | Switches Turned ON | Voltages Selected |
|---|---|---|---|---|
| 0 | 0 | 0 | S40 | Voltage at Connecting Node R23-R24 |
| 0 | 0 | 1 | S39 | Voltage at Connecting Node R22-R23 |
| 0 | 1 | 0 | S38 | Voltage at Connecting Node R21-R22 |
| 0 | 1 | 1 | S37 | Voltage at Connecting Node R20-R21 |
| 1 | 0 | 0 | S36 | Voltage at Connecting Node R19-R20 |
| 1 | 0 | 1 | S35 | Voltage at Connecting Node R18-R19 |
| 1 | 1 | 0 | S34 | Voltage at Connecting Node R17-R18 |
| 1 | 1 | 1 | S33 | Voltage at Upper End of R17 |

An analog voltage VOUT selected by the third switching circuit 22 is outputted through a buffer 23. Therefore, the D/A converter circuit can convert the nine-bit digital input signal D0-D8 into 512 different analog voltages. Since the D/A converter circuit is of the resistor string type, it does not cause the bit inversion. In addition, a layout area required by the D/A converter circuit can be reduced because the D/A converter circuit uses three-stage resistor strings and requires only 24 resistors and 40 switches.

Furthermore, since the pair of analog voltages selected from the voltages generated in the first resistor string 10 is provided to the second resistor string 17 through the buffers 15 and 16 with high input impedance and low output impedance, the second resistor string 17 does not affect the analog voltages generated in the first resistor string 10. Similarly, since the pair of analog voltages selected from the voltages generated in the second resistor string 17 is provided to the third resistor string 21 through the buffers 19 and 20 with high input impedance and low output impedance, the third resistor string 21 does not affect the analog voltages generated in the second resistor string 17.

Figure 2:
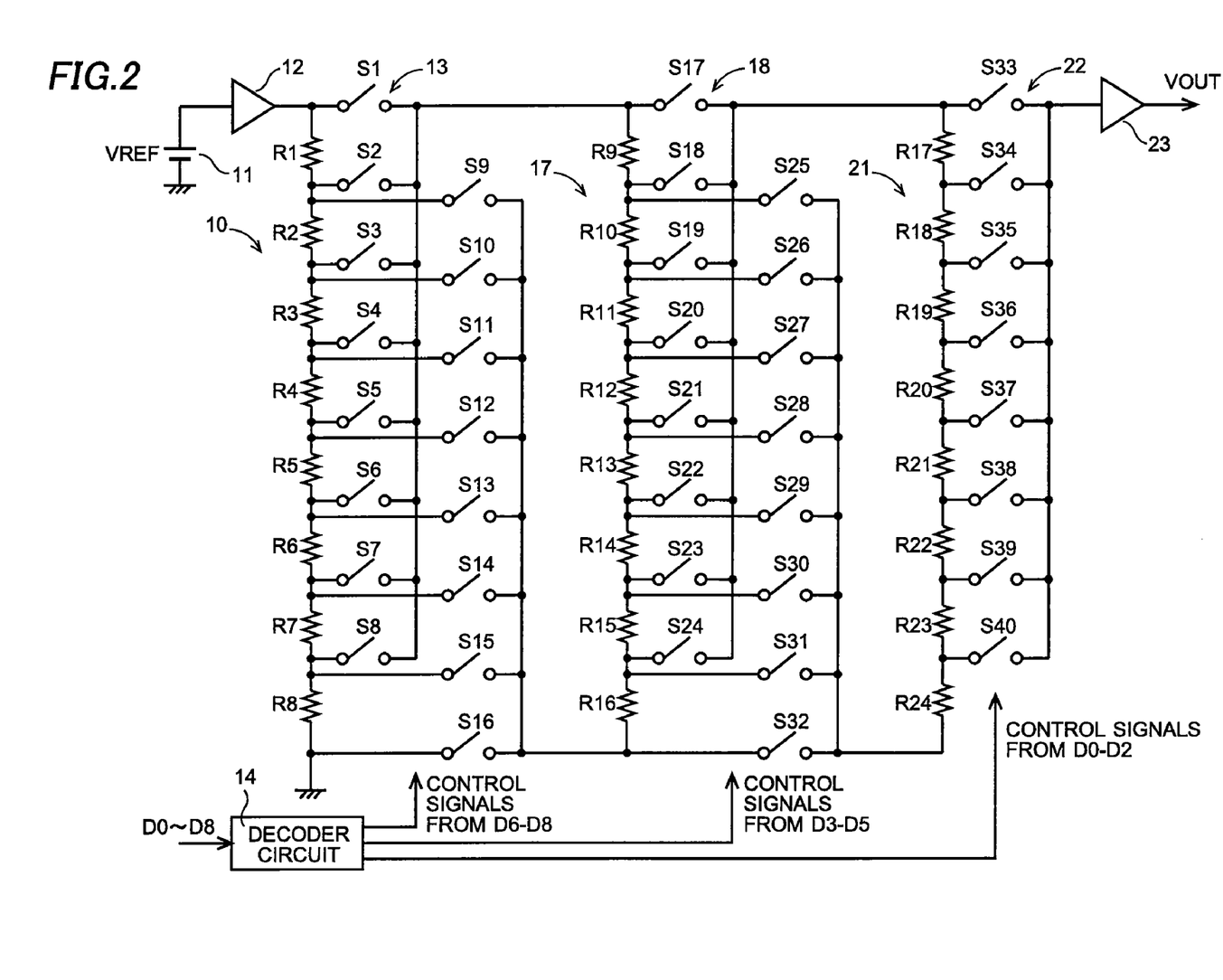
FIG. 2 is a circuit diagram showing a structure of a D/A converter circuit according to a second embodiment of this invention.

In the D/A converter circuit according to the first embodiment, the analog voltages generated in the resistor string are provided to the subsequent resistor string through the buffers (buffers 15 and 16, for example) as the reference voltages. When an offset of the buffer is affected by an analog input voltage or by temperature, however, accuracy in the D/A conversion may be degraded. Therefore, in a D/A converter circuit according to a second embodiment of this invention, the buffers 15, 16, 19 and 20 used in the first embodiment are removed and the analog voltages generated in the resistor string are directly provided to the subsequent resistor string as the reference voltages, as shown in FIG. 2. However, the analog voltages generated in the resistor string are affected and modified by the subsequent resistor string, since the subsequent resistor string is connected with the resistor string in parallel. In return, the analog voltages generated in the subsequent resistor string are also affected.

Considering the above, a resistance of each of the resistors R9-R16 in the second resistor string 17 is set to be larger than a resistance of each of the resistors R1-R8 in the first resistor string 10. Similarly, a resistance of each of the resistors R17-R24 in the third resistor string 21 is set to be larger than the resistance of each of the resistors R9-R16 in the second resistor string 17. For example, it is preferable that the resistance of each of the resistors R1-R8 in the first resistor string 10 is set to be 250Ω and that the resistance of each of the resistors R9-R16 in the second resistor string 17 is set to be 10 KΩ. By doing so, the resistor of 250Ω in the first resistor string 10 is connected in parallel with the resistors of 10 KΩ×8=80 KΩ in the second resistor string 17, which makes it possible to reduce the modification in the analog voltages substantially.

Figure 3A:
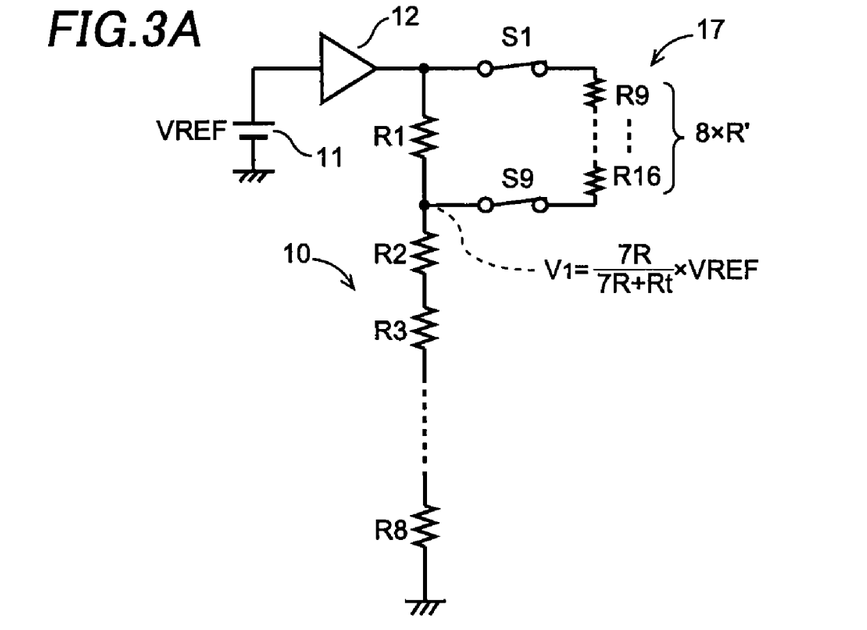
FIGS. 3A and 3B show the operations of the D/A converter circuit according to the second embodiment of this invention.
Figure 3B:
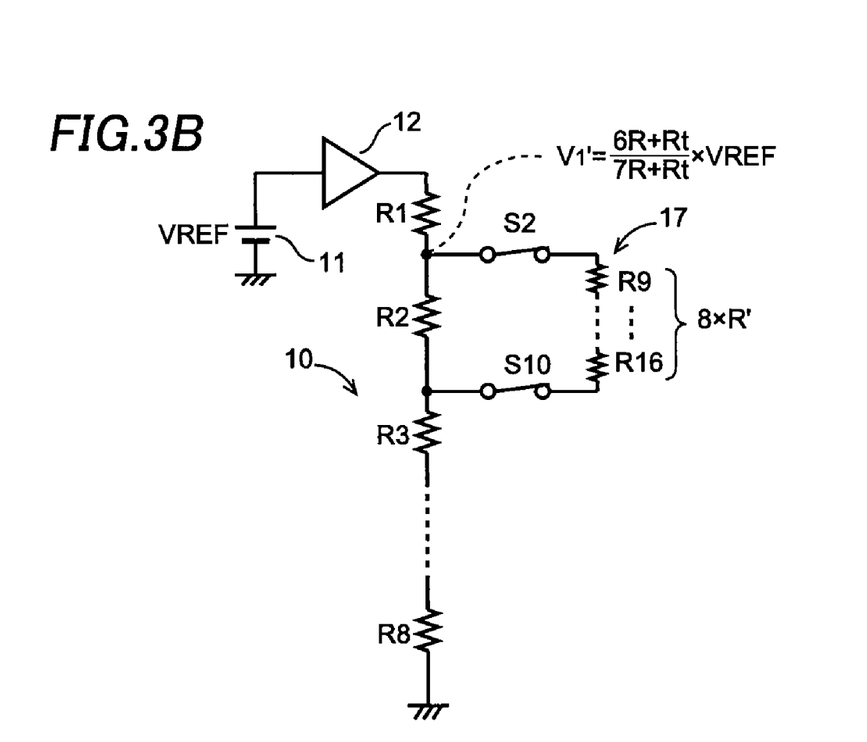
Figure 4:
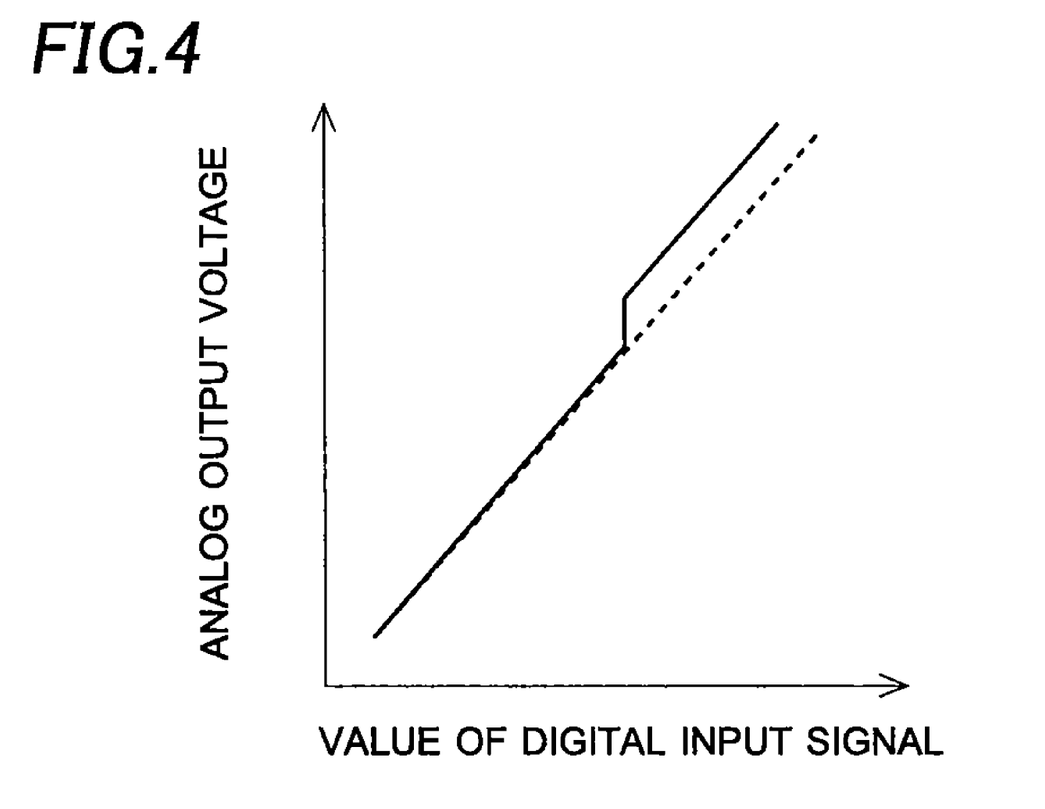
FIG. 4 shows the operations of the D/A converter circuit according to the second embodiment of this invention.

Even if the structure describe above is adopted, however, there is a problem that an abrupt change is caused in the analog output voltage as the value of the digital input signal increases, as shown in FIG. 4. This problem is explained hereafter referring to FIGS. 3A, 3B and 4.

When values of the upper three bits (D8, D7, D6) are (1, 1, 1), the switches S1 and S9 are turned on to select the voltages at both ends of the resistor R1, as shown in FIG. 3A. A voltage V1 at a connecting node between the resistor R1 and the resistor R2 is represented by the following equation.

$$V1 = \frac{7R}{7R + Rt} \times VREF \quad \text{[Equation 1]}$$

where Rt represents a resistance of a parallel combination of a resistance R of the resistor R1 and a resistance 8xR' of the serially connected eight resistors R9-R16 in the second resistor string 17. R' denotes a resistance of each of the resistors R9-R16.

When the values of the upper three bits (D8, D7, D6) are (1, 1, 0), the switches S2 and S10 are turned on to select the voltages at both ends of the resistor R2, as shown in FIG. 3B. A voltage V1' at the connecting node between the resistor R1 and the resistor R2 is represented by the following equation.

$$V1' = \frac{6R + Rt}{7R + Rt} \times VREF \quad \text{[Equation 2]}$$

The voltages V1 and V1' should be equal to each other because they represent the voltage at the same node. In reality, however, there is a voltage difference ΔV represented by the following equation.

$$\Delta V = V1 - V1' = \frac{R - Rt}{7R + Rt} \times VREF \quad \text{[Equation 3]}$$

ΔV has a positive value because R>Rt. Therefore, the abrupt change as shown in FIG. 4 is caused when the values of the upper three bits (D8, D7, D6) in the digital signal changes from (1, 1, 0) to (1, 1, 1).

Figure 5:
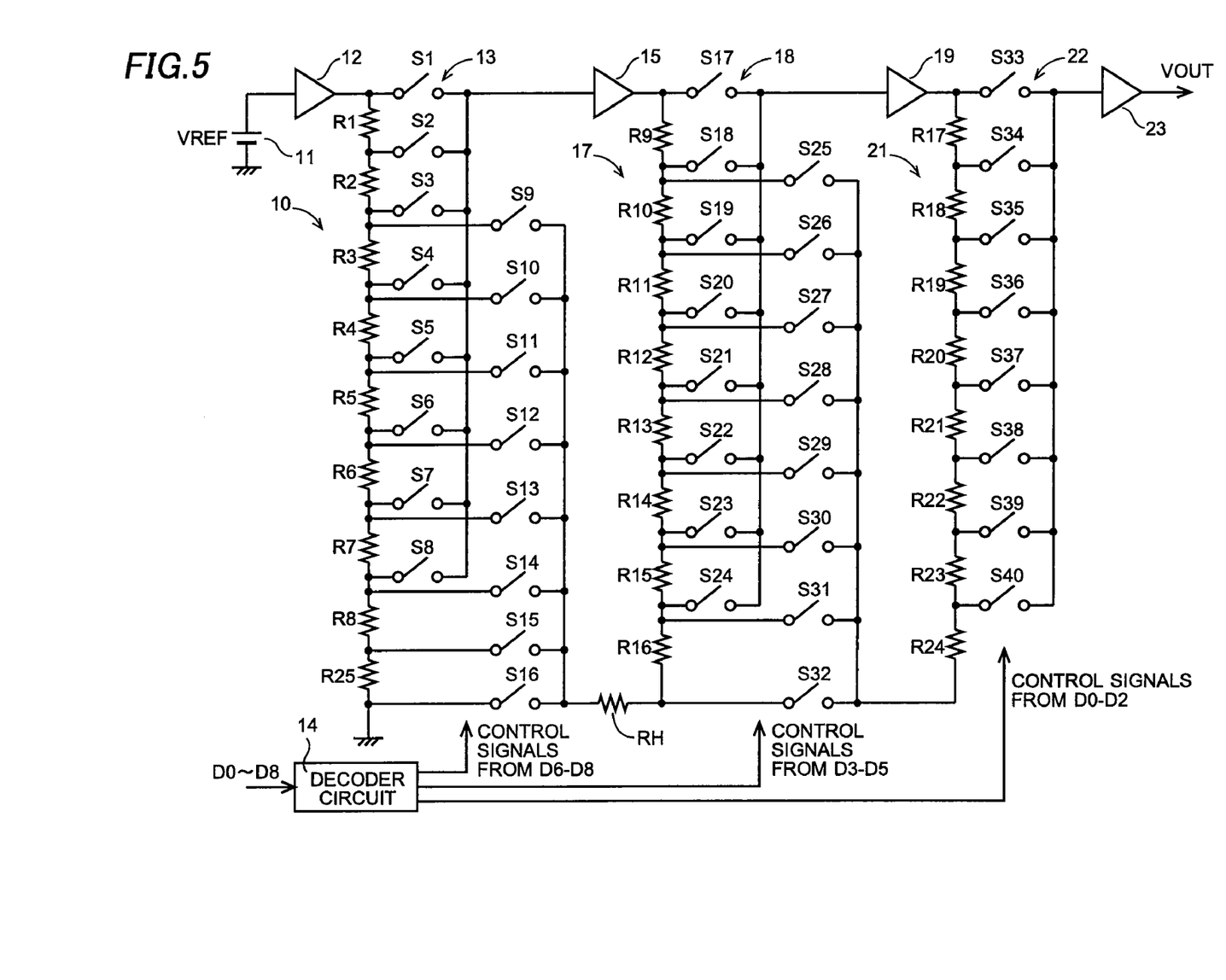
FIG. 5 is a circuit diagram showing a structure of a D/A converter circuit according to a third embodiment of this invention.

Considering the above, a D/A converter circuit according to a third embodiment of this invention is provided with an adjusting resistor RH to adjust the abrupt change, which is connected in series with the resistors R9-R16 in the second resistor string 17, as shown in FIG. 5.

In addition, a resistor R25 is added to the first resistor string 10. Also, the first switching circuit 13 is modified so as to select a pair of analog voltages generated at both ends of two serially-connected neighboring resistors selected from among the resistors R1-R8 and R25. Table 4 shows correlation between the values of the upper three bits (D8, D7, D6) and the switches turned on accordingly.

TABLE 4

| D8 | D7 | D6 | Switches Turned ON | Voltages Selected |
|---|---|---|---|---|
| 0 | 0 | 0 | S8, S16 | Voltages at Both Ends of R8-R25 |
| 0 | 0 | 1 | S7, S15 | Voltages at Both Ends of R7-R8 |
| 0 | 1 | 0 | S6, S15 | Voltages at Both Ends of R6-R7 |
| 0 | 1 | 1 | S5, S13 | Voltages at Both Ends of R5-R6 |
| 1 | 0 | 0 | S4, S12 | Voltages at Both Ends of R4-R5 |
| 1 | 0 | 1 | S3, S11 | Voltages at Both Ends of R3-R4 |
| 1 | 1 | 0 | S2, S10 | Voltages at Both Ends of R2-R3 |
| 1 | 1 | 1 | S1, S9 | Voltages at Both Ends of R1-R2 |

Figure 6A:
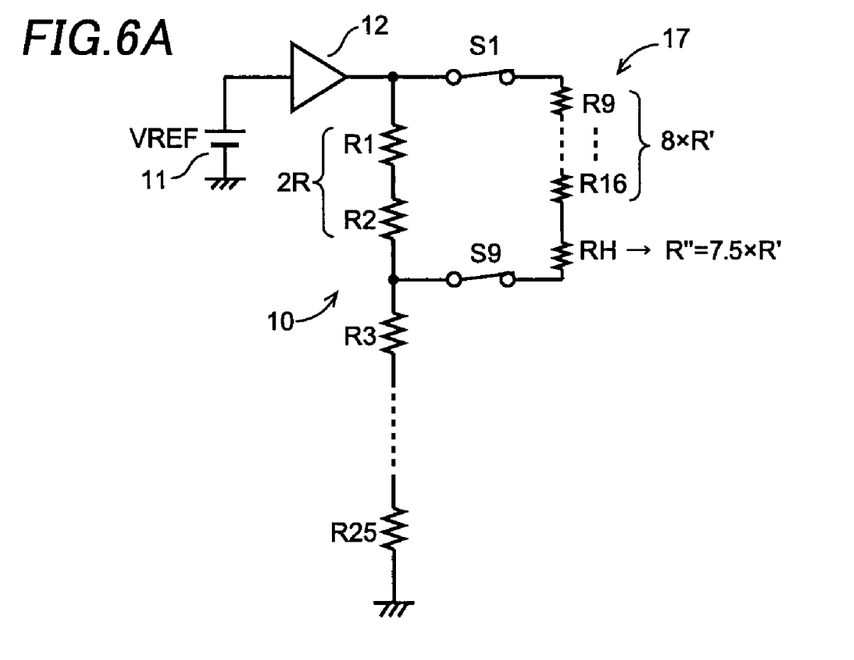
FIGS. 6A and 6B are circuit diagrams showing operations of the D/A converter circuit according to the third embodiment of this invention.
Figure 6B:
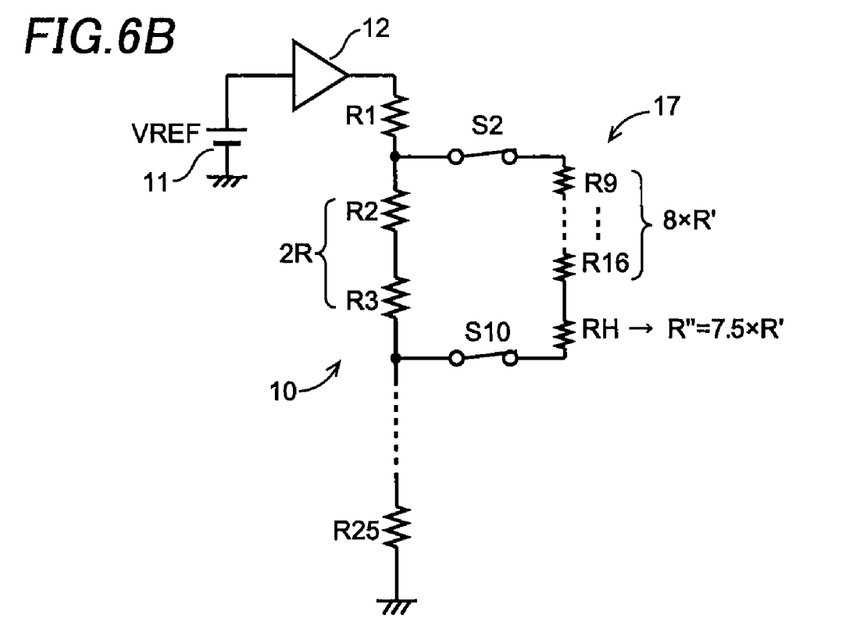

For example, when the values of the upper three bits (D8, D7, D6) are (1, 1, 1), the switches S1 and S9 are turned on to select the voltages at both ends of the resistors R1 and R2, as shown in FIG. 6A. Then, the selected voltages are provided to the second resistor string 17 as the reference voltages. Also, when the values of the upper three bits (D8, D7, D6) are (1, 1, 0), the switches S2 and S10 are turned on to select the voltages at both ends of the resistors R2 and R3, as shown in FIG. 6B. Then, the selected voltages are provided to the second resistor string 17 as the reference voltages.

As the resistance of the serially-connected eight resistors R9-R16 in the second resistor string 17 is 8xR', the abrupt change described above is similarly caused when a resistance of the adjusting resistor RH is equal to 8xR'. It is preferable to attain an effect of adjustment to reduce the abrupt change that the resistance of the adjusting resistor RH is slightly smaller than 8xR'. According to results of circuit simulations conducted by the inventor, the effect of adjustment appeared to be obtained when the resistance of the adjusting resistor RH was set to be 7.5xR', which is smaller than 8xR' by an amount corresponding to a half of the increment in the digital data.

Figure 7:
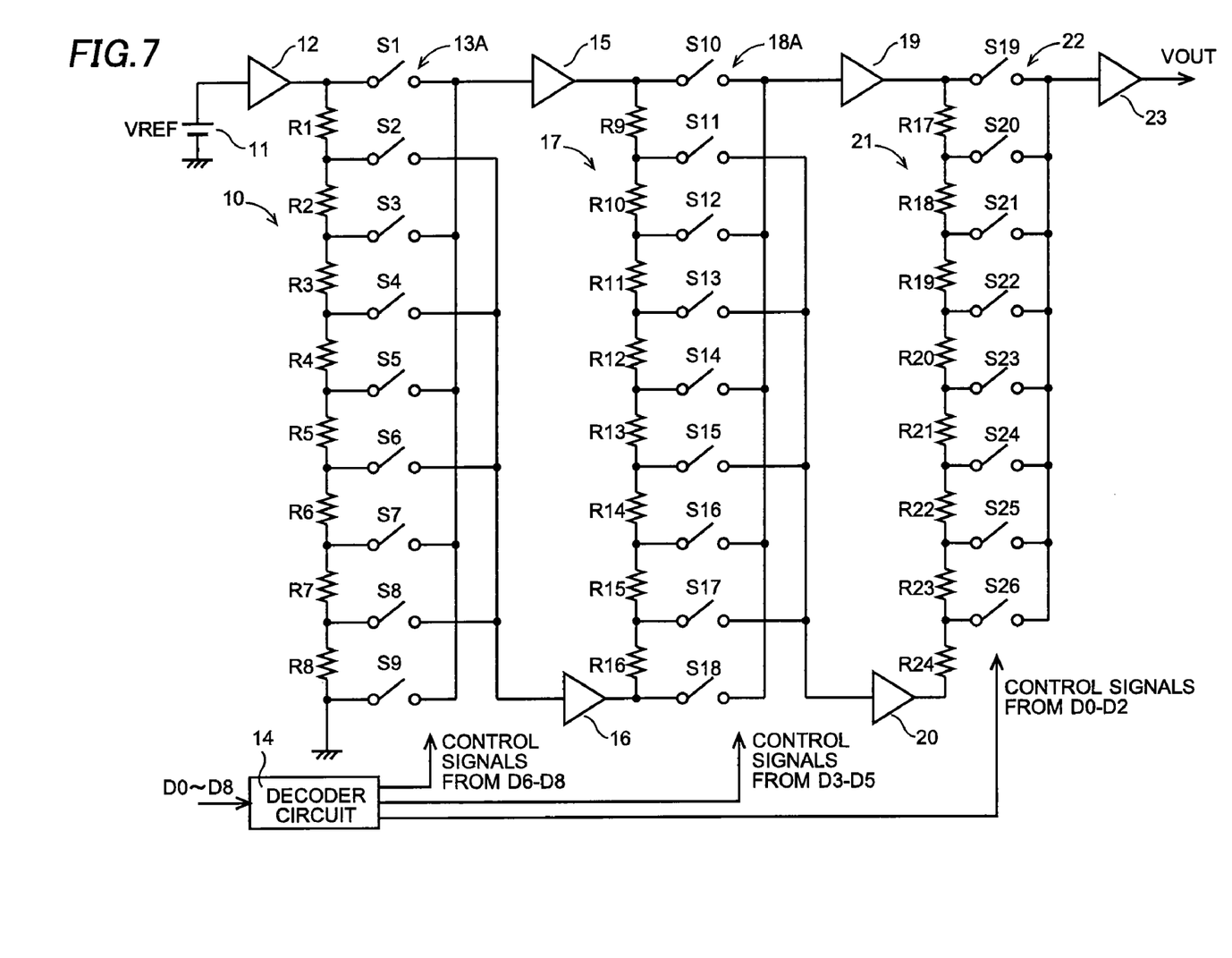
FIG. 7 is a circuit diagram showing a structure of a D/A converter circuit according to a fourth embodiment of this invention.

In a D/A converter circuit according to a fourth embodiment of this invention, the number of switches is further reduced by modifying the structure of the first switching circuit 13 and the second switching circuit 18 in the D/A converter circuit according to the first embodiment. Although the explanation is given hereafter based on modifications applied to the D/A converter according to the first embodiment, similar modifications may be applied to the D/A converters according to the second and third embodiments.

A first switching circuit 13A is composed of nine switches S1-S9, and a second switching circuit 18A is also composed of nine switches S10-S18, as shown in FIG. 7. Table 5 shows correlation between the values of the upper three bits (D8, D7, D6) and the switches turned on accordingly, regarding the first switching circuit 13A.

TABLE 5

| D8 | D7 | D6 | Switches Turned ON | Voltages Selected |
|---|---|---|---|---|
| 0 | 0 | 0 | S8, S9 | Voltages at Both Ends of R8 |
| 0 | 0 | 1 | S7, S8 | Voltages at Both Ends of R7 |

TABLE 5-continued

| D8 | D7 | D6 | Switches Turned ON | Voltages Selected |
|---|---|---|---|---|
| 0 | 1 | 0 | S6, S7 | Voltages at Both Ends of R6 |
| 0 | 1 | 1 | S5, S6 | Voltages at Both Ends of R5 |
| 1 | 0 | 0 | S4, S5 | Voltages at Both Ends of R4 |
| 1 | 0 | 1 | S3, S4 | Voltages at Both Ends of R3 |
| 1 | 1 | 0 | S2, S3 | Voltages at Both Ends of R2 |
| 1 | 1 | 1 | S1, S2 | Voltages at Both Ends of R1 |

Figure 8A:
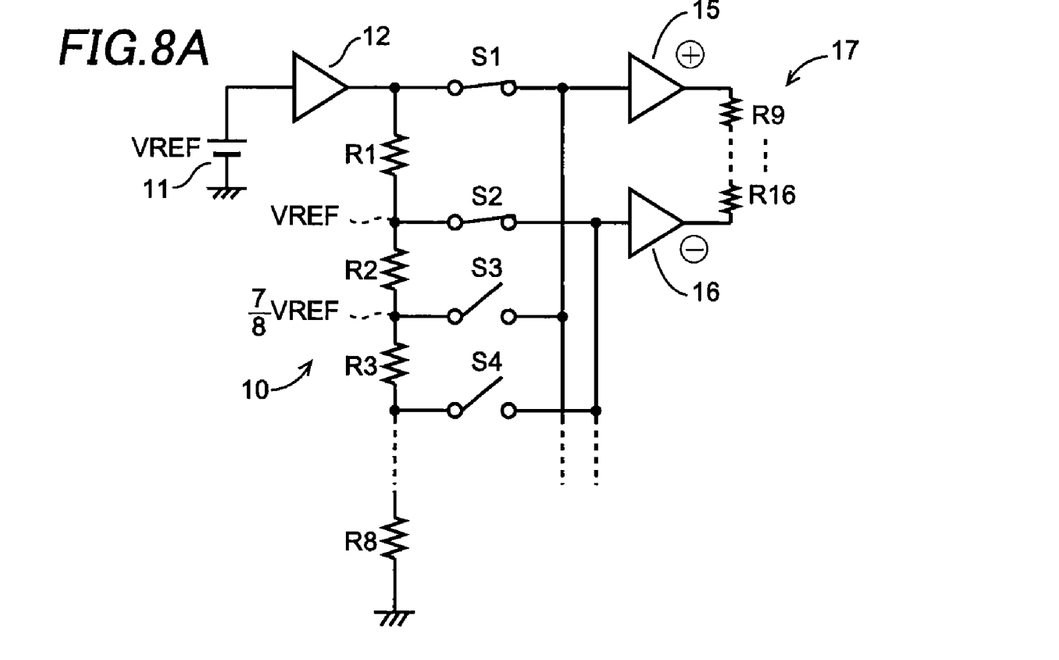
FIGS. 8A and 8B are circuit diagrams showing operations of the D/A converter circuit according to the fourth embodiment of this invention.

It should be noted that relative heights of reference voltages provided to the second resistor string 17 are reversed when a pair of voltages across one of even-numbered resistors R2, R4, R6 and R8 is selected. This point is further explained below. When the values of the upper three bits (D8, D7, D6) are (1, 1, 1), the switches S1 and S2 are turned on, as shown in FIG. 8A. Then, the voltage VREF at an upper end of the resistor R1 is applied to the buffer 15 while a voltage 7/8xVREF at a lower end of the resistor R1 is applied to the buffer 16.

Figure 8B:
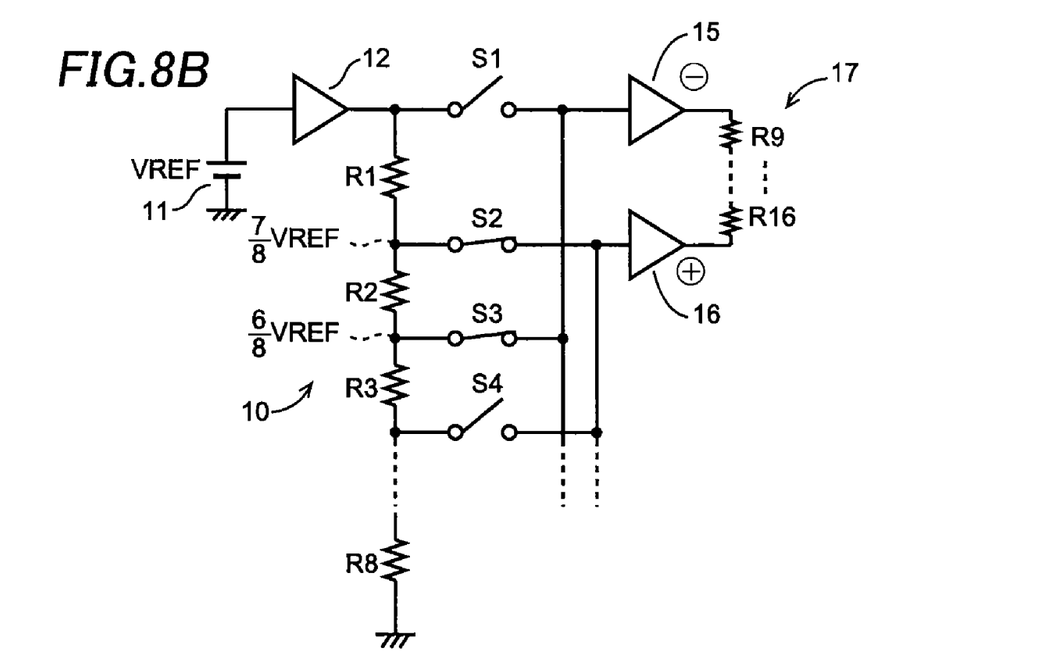

On the other hand, when the values of the upper three bits (D8, D7, D6) are (1, 1, 0), the switches S2 and S3 are turned on, as shown in FIG. 8B. Then, a voltage 7/8xVREF at an upper end of the resistor R2 is applied to the buffer 16 while a voltage 6/8xVREF at a lower end of the resistor R2 is applied to the buffer 15.

When the relative heights of the reference voltages provided to the second resistor string 17 are reversed as described above, turning on/off of the switches in the second switching circuit 18A needs to be modified accordingly.

With the D/A converter circuits (six-bits or more than six-bits) according to the embodiments of this invention, the bit inversion can be prevented and the layout area can be reduced.

What is claimed is:

1. A D/A converter circuit that converts an input digital signal comprising a plurality of upper bits and a plurality of lower bits into an analog voltage, comprising:
    a first resistor string that comprises a plurality of first resistors connected in series and generates a plurality of first analog voltages;
    a first switching circuit that selects a pair of first analog voltages out of the first analog voltages generated by the first resistor string according to the upper bits;
    a second resistor string that comprises a plurality of second resistors connected in series, is provided with the pair of first analog voltages as reference voltages and generates a plurality of second analog voltages; and
    a second switching circuit that selects a pair of second analog voltages out of the second analog voltages generated by the second resistor string according to the lower bits,
    wherein the selected pair of the first analog voltages is provided to the second resistor string without passing through a buffer, and
    a resistance of the second resistors is larger than a resistance of the first resistors.

2. The D/A converter circuit of claim 1, wherein the first switching circuit is configured to supply, in one instance, a first analog voltage generated at one end of one first resistor to the second resistor string as a first reference voltage and another first analog voltage generated at another end of said one first resistor that is lower than the first analog voltage supplied as the first reference voltage to the second resistor string as a second reference voltage.

3. A D/A converter circuit of that converts an input digital signal comprising a plurality of upper bits and a plurality of lower bits into an analog voltage, comprising:
    a first resistor string that comprises a plurality of first resistors connected in series and generates a plurality of first analog voltages;
    a first switching circuit that selects a pair of first analog voltages out of the first analog voltages generated by the first resistor string according to the upper bits;
    a second resistor string that comprises a plurality of second resistors connected in series, is provided with the pair of first analog voltages as reference voltages and generates a plurality of second analog voltages; and
    a second switching circuit that selects a pair of second analog voltages out of the second analog voltages generated by the second resistor string according to the lower bits,
    wherein the first switching circuit is configured to supply, in one instance, a first analog voltage generated at one end of one first resistor to the second resistor string as a first reference voltage and another first analog voltage generated at another end of said one first resistor that is lower than the first analog voltage supplied as the first reference voltage to the second resistor string as a second reference voltage, and
    the first switching circuit is configured to supply, in another instance, a first analog voltage generated at one end of another first resistor to the second resistor string as the first reference voltage and another first analog voltage generated at another end of said another first resistor that is higher than the first analog voltage supplied as the first reference voltage in said another instance to the second resistor string as the second reference voltage.

4. A D/A converter circuit that converts an input digital signal comprising a plurality of upper bits and a plurality of lower bits into an analog voltage, comprising:
    a first resistor string that comprises a plurality of first resistors connected in series and generates a plurality of first analog voltages;
    a first switching circuit that selects a pair of first analog voltages out of the first analog voltages generated by the first resistor string according to the upper bits;
    a second resistor string that comprises a plurality of second resistors connected in series, is provided with the pair of first analog voltages as reference voltages and generates a plurality of second analog voltages; and
    a second switching circuit that selects a pair of second analog voltages out of the second analog voltages generated by the second resistor string according to the lower bits,
    wherein the first switching circuit is configured to supply a first analog voltage generated at one end of two consecutive first resistors connected in series to the second resistor string as a first reference voltage and another analog voltage generated at another end of the two consecutive first resistors connected in series to the second resistor string as a second reference voltage.

5. A D/A converter circuit that converts an input digital signal comprising a plurality of upper bits and a plurality of lower bits into an analog voltage, comprising:
    a first resistor string that comprises a plurality of first resistors connected in series and generates a plurality of first analog voltages;
    a first switching circuit that selects a pair of first analog voltages out of the first analog voltages generated by the first resistor string according to the upper bits;

a second resistor string that comprises a plurality of second resistors connected in series, is provided with the pair of first analog voltages as reference voltages and generates a plurality of second analog voltages; and a second switching circuit that selects a pair of second analog voltages out of the second analog voltages generated by the second resistor string according to the lower bits, wherein the first switching circuit selects a pair of first analog voltages generated at both ends of two consecutive first resistors connected in series, and the second resistor string further comprises an adjusting resistor connected in series with the second resistors to adjust an abrupt change caused in the analog output voltage in response to the digital input signal.

* * * * *